(12) United States Patent
Kojima

(10) Patent No.: US 9,138,996 B2
(45) Date of Patent: Sep. 22, 2015

(54) LIQUID EJECTING HEAD, LIQUID EJECTING APPARATUS, PIEZOELECTRIC ELEMENT AND ULTRASONIC SENSOR

(71) Applicant: Seiko Epson Corporation, Tokyo (JP)

(72) Inventor: Chikara Kojima, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/219,969

(22) Filed: Mar. 19, 2014

(65) Prior Publication Data

US 2014/0307034 A1    Oct. 16, 2014

(30) Foreign Application Priority Data

Mar. 22, 2013    (JP) ................................ 2013-059602

(51) Int. Cl.
| | |
|---|---|
| B41J 2/045 | (2006.01) |
| B41J 2/14 | (2006.01) |
| H01L 41/047 | (2006.01) |
| H01L 41/09 | (2006.01) |

(52) U.S. Cl.
CPC .......... *B41J 2/14201* (2013.01); *B41J 2/14233* (2013.01); *H01L 41/047* (2013.01); *H01L 41/0973* (2013.01); *B41J 2002/14241* (2013.01); *B41J 2002/14419* (2013.01); *B41J 2002/14491* (2013.01); *B41J 2202/03* (2013.01)

(58) Field of Classification Search
CPC ................................. B41J 2/03; B41J 2/04581
USPC ...................................................... 347/70–71
See application file for complete search history.

(56) References Cited

U.S. PATENT DOCUMENTS

| | | | | |
|---|---|---|---|---|
| 6,419,848 | B1* | 7/2002 | Qiu et al. ................. | 252/62.9 R |
| 2006/0290747 | A1* | 12/2006 | Shimada et al. ................ | 347/68 |
| 2009/0219345 | A1 | 9/2009 | Yazaki et al. | |
| 2009/0284568 | A1 | 11/2009 | Yazaki | |
| 2013/0265371 | A1* | 10/2013 | Yazaki ............................ | 347/70 |

FOREIGN PATENT DOCUMENTS

| | | |
|---|---|---|
| JP | 2009-172878 A | 8/2009 |
| JP | 2009-196329 A | 9/2009 |

* cited by examiner

*Primary Examiner* — Shelby Fidler
*Assistant Examiner* — Tracey McMillion
(74) *Attorney, Agent, or Firm* — Kilpatrick Townsend & Stockton LLP

(57) ABSTRACT

A liquid ejecting head includes a flow channel-forming substrate in which a pressure generating chamber that communicates with a nozzle opening is provided; and a piezoelectric element that includes a first electrode provided on one surface side of the flow channel-forming substrate corresponding to the pressure generating chamber, a piezoelectric layer provided on the first electrode, and a second electrode provided on the piezoelectric layer, in which the first electrode configures a separate electrode that is independent for each active portion that is a substantial driving portion of the piezoelectric element, the second electrode configures a common electrode shared with the active portion, the piezoelectric element extends up to the outer side of the pressure generating chamber in at least one end of the pressure generating chamber, and the piezoelectric element includes a weighting film provided to overlap to one end of the pressure generating chamber on the second electrode in a region extended up to the outer side of the pressure generating chamber, where (film thickness of weighting film×Young's modulus)/(film thickness of piezoelectric layer×Young's modulus) is in a range of 0.6 or higher and 1.2 or lower.

6 Claims, 6 Drawing Sheets

LIQUID EJECTING HEAD, LIQUID EJECTING APPARATUS, PIEZOELECTRIC ELEMENT AND ULTRASONIC SENSOR

This application claims priority to Japanese Patent Application No. 2013-059602, filed Mar. 22, 2013, the entirety of which is incorporated by reference herein.

BACKGROUND

1. Technical Field

The present invention relates to a liquid ejecting head that ejects a liquid from a nozzle opening, a liquid ejecting apparatus, a piezoelectric element, and an ultrasonic sensor.

2. Related Art

A liquid ejecting head that ejects droplets from a nozzle that communicates with a pressure generating chamber by causing pressure changes on the liquid in the pressure generating chamber by causing a piezoelectric element (actuator) to be deformed is known in the related art. A representative example thereof is an ink jet recording head that ejects ink droplets as the droplet.

The ink jet recording head, for example, includes a piezoelectric element on one surface side of a flow channel-forming substrate in which a pressure generating chamber that communicates with a nozzle is provided, and causes ink droplets to be ejected from the nozzle by causing a pressure change in the pressure generating chamber by deforming a diaphragm through the driving of the piezoelectric element.

Here, the piezoelectric element is configured to have a first electrode, a piezoelectric layer and a second electrode formed on a diaphragm, and the piezoelectric layer, for example, has a problem of being prone to damage caused by moisture or the like in the external environment. In order to solve this problem, a configuration in which the second electrode covers the outer peripheral surface of the piezoelectric layer may be used. More specifically, there are piezoelectric elements in which a separate electrode is provided as a first electrode for each pressure generating chamber, and common electrode is continuously provided as a second electrode across a plurality of pressure generating chambers, and the outer peripheral surface of the piezoelectric layer is covered by the second electrode (for example, refer to JP-A-2009-172878 and JP-A-2009-196329).

However, when the piezoelectric element is driven, a problem arises in that there is concern of stress concentrating in the piezoelectric element on the end portion of a space such as the pressure generating chamber and damage, such as cracking, occurring in the piezoelectric element.

Such a problem arises not only in an ink jet recording head, but also similarly arises in any liquid ejecting head. In addition, such a problem arises not only in a piezoelectric element mounted to a liquid ejecting head, but similarly arises in piezoelectric elements used in ultrasonic sensors, and similarly arises in piezoelectric elements used in other devices other than liquid ejecting heads and ultrasonic sensors.

SUMMARY

An advantage of some aspects of the invention is to provide a liquid ejecting head in which damage is suppressed, a liquid ejecting apparatus, a piezoelectric element, and an ultrasonic sensor.

According to an aspect of the invention, there is provided a liquid ejecting head including a flow channel-forming substrate in which a pressure generating chamber that communicates with a nozzle opening is provided; and a piezoelectric element that includes a first electrode provided on one surface side of the flow channel-forming substrate corresponding to the pressure generating chamber, a piezoelectric layer provided on the first electrode, and a second electrode provided on the piezoelectric layer, in which the first electrode configures a separate electrode that is independent for each active portion that is a substantial driving portion of the piezoelectric element, the second electrode configures a common electrode shared with the active portion, the piezoelectric element extends up to the outer side of the pressure generating chamber in at least one end of the pressure generating chamber, and the piezoelectric element includes a weighting film provided to overlap to one end of the pressure generating chamber on the second electrode in a region extended up to the outer side of the pressure generating chamber, where (film thickness of weighting film×Young's modulus)/(film thickness of piezoelectric layer×Young's modulus) is in a range of 0.6 or higher and 1.2 or lower.

According to the aspect, by regulating the film thickness of the weighting film, it is possible to suppress the concentration of stress in the end portion of the pressure generating chamber of the piezoelectric element and the concentration of stress in the end portion of the active portion side of the weighting film, and to suppress damage due to the concentration of stress.

Here, it is preferable that the film thickness of the piezoelectric layer be 0.5 μm or higher and 3.0 μm or less. In so doing, a piezoelectric element with superior piezoelectric characteristics may be realized at high density.

It is preferable that the weighting film be formed from at least one material selected from a group consisting of gold, copper and nickel. In so doing, it is possible to increase the conductivity, lower the electric resistance value of the second electrode and the weighting film and to form the second electrode to be thin, and possible to improve the displacement characteristics of the piezoelectric element.

According to another aspect of the invention, there is provided a liquid ejecting apparatus including the liquid ejecting head of the above aspect.

According to the aspect, a liquid ejecting apparatus may be realized in which reliability is improved by suppressing damage.

According to another aspect of the invention, there is provided a piezoelectric element that includes a first electrode provided on one surface side of substrate in which a space is provided corresponding to the space, a piezoelectric layer provided on the first electrode, and a second electrode provided on the piezoelectric electrode, in which the first electrode configures a separate electrode that is independent for each active portion that is a substantial driving portion of the piezoelectric element, the second electrode configures a common electrode shared with the active portion, the piezoelectric element extends up to the outer side of the space in at least one end of the space, the piezoelectric element includes a weighting film provided to overlap to one end of the space on the second electrode in a region extended up to the outer side of the space, and the film thickness of the weighting film is in a range in which a ratio of the product of the film thickness of the weighting film and the Young's modulus with respect to the product of the film thickness of piezoelectric layer and the Young's modulus is in a range of 0.6 or higher and 1.2 or lower.

According to the aspect, by regulating the film thickness of the weighting film, it is possible to suppress the concentration of stress in the end portion of the pressure generating chamber of the piezoelectric element and the concentration of stress in the end portion of the active portion side of the weighting film, and to suppress damage due to the concentration of stress.

According to still another aspect of the invention, there is provided an ultrasonic sensor including at least one piezoelectric element of the above aspects.

According to the aspect, by regulating the film thickness of the weighting film, it is possible to suppress the concentration of stress in the end portion of the pressure generating chamber of the piezoelectric element and the concentration of stress in the end portion of the active portion side of the weighting film, and to suppress damage due to the concentration of stress.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the present invention is explained in detail based on the embodiments.

Embodiment 1

Figure 1:
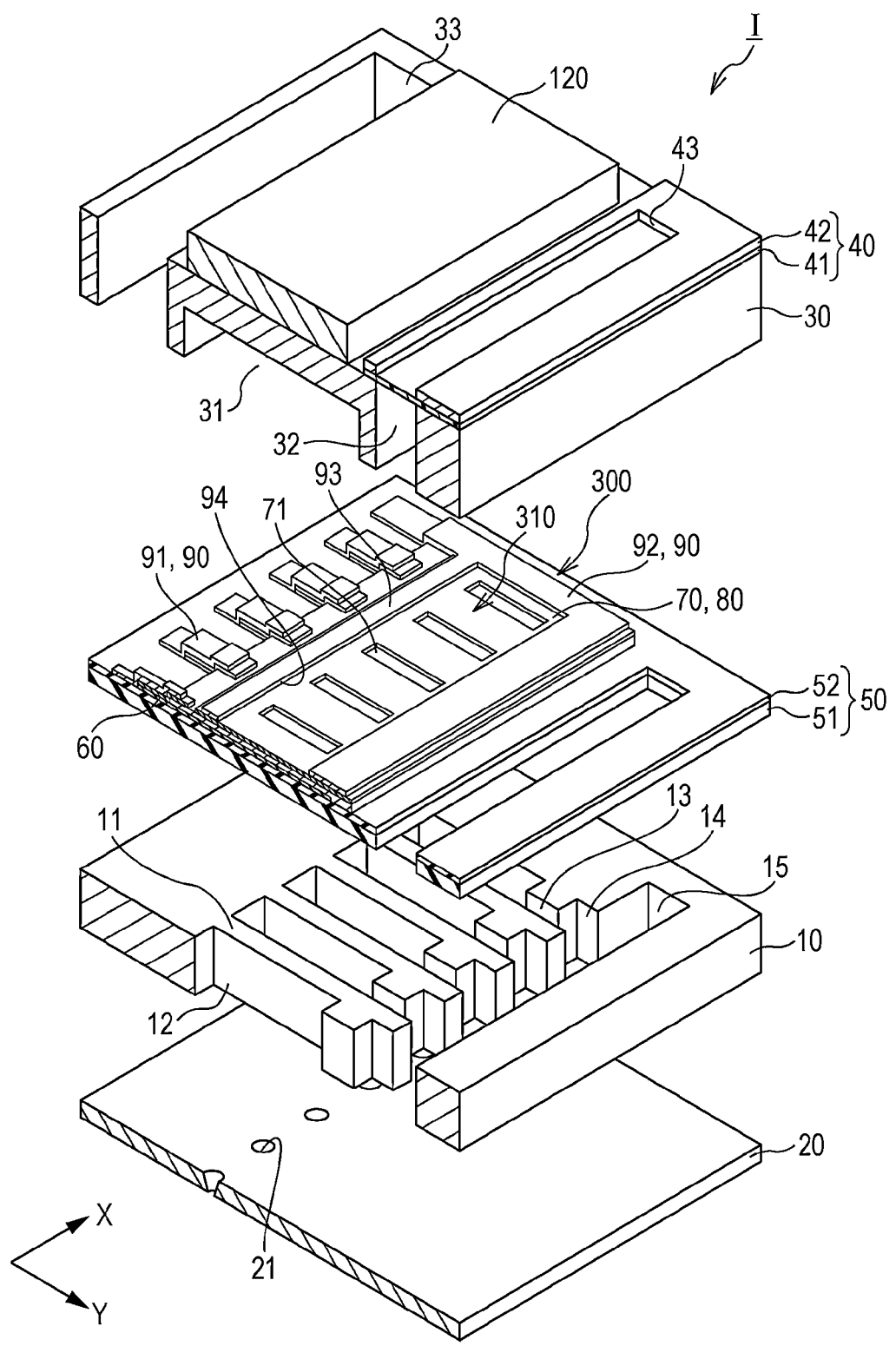
FIG. 1 is an exploded perspective view of a recording head according to the Embodiment 1 of the present invention.
Figure 2:
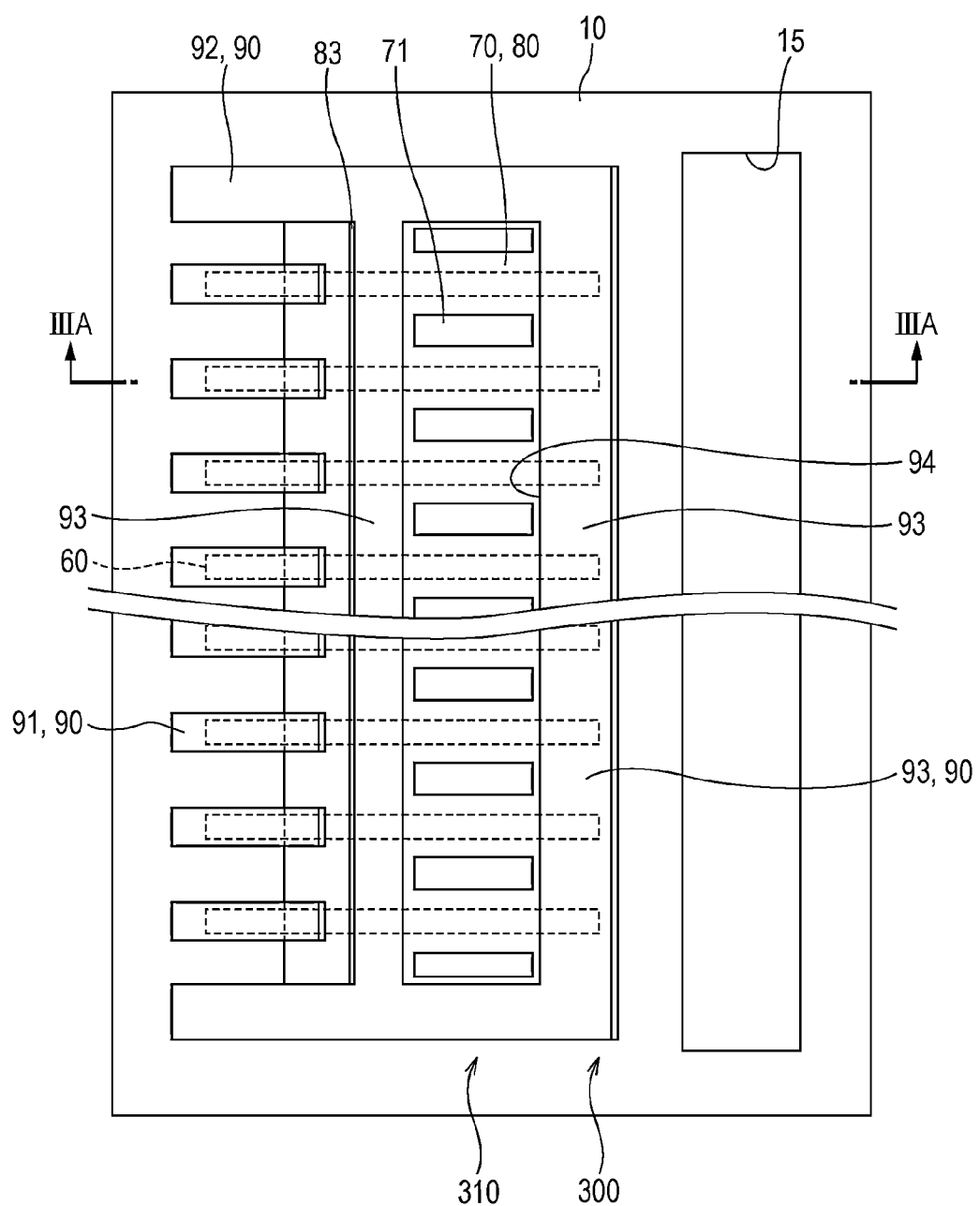
FIG. 2 is a plan view of the recording head according Embodiment 1 of the invention.
Figure 3A:
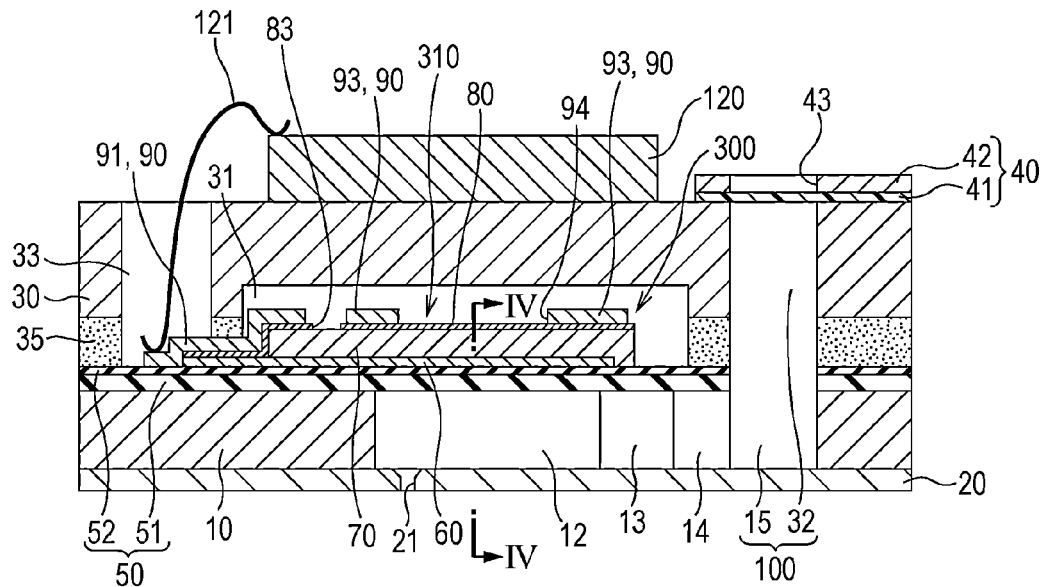
FIG. 3A is a cross-sectional view taken along line IIIA-IIIA in FIG. 2.
Figure 3B:
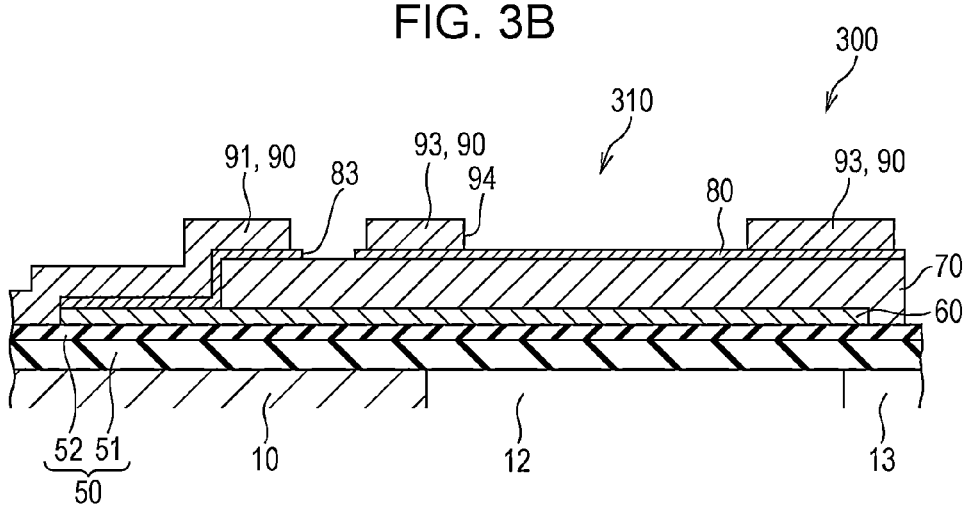
FIG. 3B is a partially enlarged view of FIG. 3A.
Figure 4:
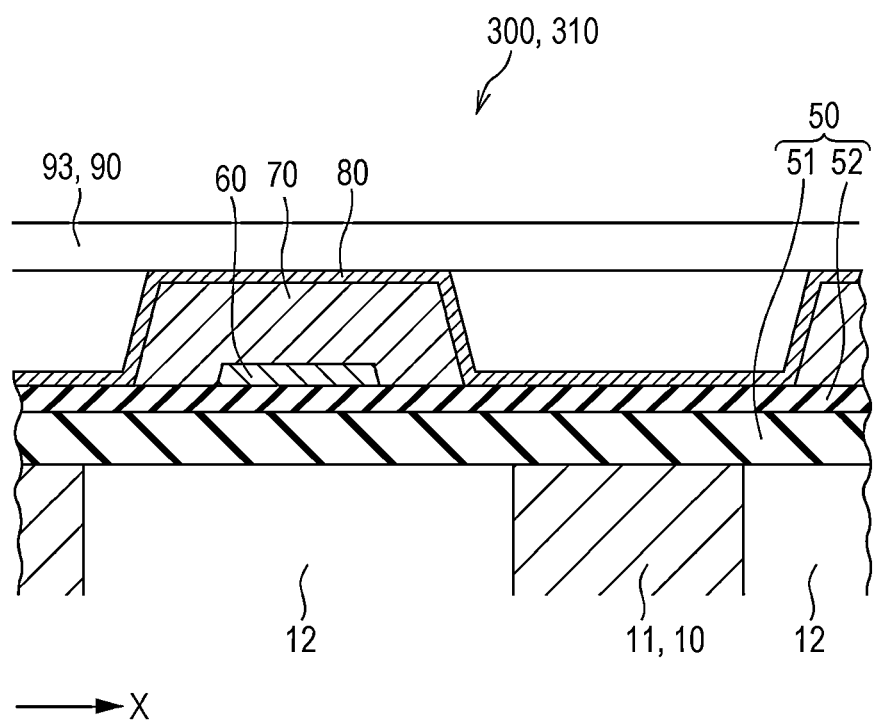
FIG. 4 is a cross-sectional view taken along line IV-IV in FIG. 3A.

FIG. 1 is a perspective view of an ink jet recording head that is one example of a liquid ejecting head according to Embodiment 1 of the invention, FIG. 2 is a plan view of a flow channel-forming substrate of an ink jet recording head, FIG. 3A is a cross-sectional view taken along line IIIA-IIIA in FIG. 2, FIG. 3B is a partially enlarged view of FIG. 3A and FIG. 4 is a cross-sectional view taken along line IV-IV in FIG. 3A.

As shown in the drawings, a pressure generating chamber 12 is formed as a space in the flow channel-forming substrate 10 included in the ink jet recording head I that is one example of the liquid ejecting head of the embodiment. A pressure generating chamber 12 divided by a plurality of dividing walls 11 is arranged in parallel along a direction in which a plurality of nozzle openings 21 that discharge the same color of ink is arranged in parallel. Hereinafter, this direction is referred to as the parallel direction of the pressure generating chamber 12, or as the first direction X. In addition, a direction orthogonal to the first direction X is hereinafter referred to as the second direction Y.

On one end portion side in the longitudinal direction of the pressure generating chamber 12 of the flow channel-forming substrate 10, that is, on one end portion side in the second direction Y orthogonal to the first direction X, an ink supply channel 13 and a communication channel 14 are divided by a plurality of dividing walls 11. A communication portion 15 that configures a portion of a manifold 100 that is a common ink chamber (liquid chamber) for each pressure generating chamber 12 is formed on the outer side of the communication channel 14 (opposite side in the second direction Y to the pressure generating chamber 12). That is, a liquid flow channel formed from the pressure generating chamber 12, the ink supply channel 13, communication channel 14 and the communication portion 15 is provided on the flow channel-forming substrate 10.

A nozzle plate 20 in which nozzle openings 21 that communicate with each pressure generating chamber 12 are bored is bonded to one surface side of the flow channel-forming substrate 10, that is, to the surface in which the liquid flow channels of the pressure generating chamber 12, or the like, open by an adhesive or a thermally weldable film or the like. That is, the nozzle openings 21 are arranged in parallel in the nozzle plate 20 in the first direction X.

Meanwhile, a diaphragm 50 is formed on the opposite side to the nozzle plate 20 of the flow channel-forming substrate 10. In the embodiment, an elastic film 51 composed of silicon oxide provided on the flow channel-forming substrate 10 side and an insulating film 52 composed of zirconium oxide provided on the elastic film 51 are provided as the diaphragm 50. The liquid flow channel of the pressure generating chamber 12 or the like, is formed by anisotropic etching of the flow channel-forming substrate 10 from one surface side (surface side to which the nozzle plate 20 is bonded), and the other surface of the liquid flow channel of the pressure generating chamber 12 or the like is defined by the elastic film 51.

Here, in addition to the diaphragm 50 (in the case of a laminated film, electrode forming side) being an insulating body, and being able to withstand the temperatures (generally 500° C. or higher) during forming of the piezoelectric layer 70, in a case in which anisotropic etching using KOH (potassium hydroxide) is used, it is necessary that the diaphragm (in the case of a laminated film, the silicon wafer side) function as an etching stop layer when a silicon wafer is used for the flow channel-forming substrate 10 and a flow channel of a pressure generating chamber 12 or the like is formed. In a case when silicon dioxide is used in a portion of the diaphragm 50, when lead or bismuth is included in the piezoelectric layer 70 is diffused in silicon dioxide, the silicon dioxide is deteriorated, and the upper layer electrode or the piezoelectric layer 70 peels off. Therefore, a diffusion preventing layer is also necessary on the silicon dioxide.

The diaphragm 50 in which silicon dioxide and zirconium oxide are laminated is most preferred because each of the materials withstands the temperatures when the piezoelectric layer 70 is formed, the silicon dioxide functions as an insulating layer and an etching stop layer, and the zirconium oxide functions as an insulating layer and a diffusion preventing layer. In the embodiment, although the diaphragm 50 is formed by the elastic film 51 and the insulating film 52, only one of either of the elastic film 51 and the insulating film 52 may be provided as the diaphragm 50.

A piezoelectric element 300 having a first electrode 60, a piezoelectric layer 70 and a second electrode 80 is formed on the diaphragm 50. Here, the piezoelectric element 300 refers to the portion that contains the first electrode 60, the piezoelectric layer 70, and the second electrode 80. The piezoelectric element 300 is configured from first electrode 60 and the second electrode 80 with the piezoelectric layer 70 interposed therebetween. The portion that is a substantial active portion in which piezoelectric distortion due to the application a voltage to both electrodes is referred to as an active portion 310. In the embodiment, although described in detail later, the first electrode 60 is set to an individual electrode provided for each active portion 310, and the second electrode 80 is set as a common electrode for a plurality of active portions 310.

More specifically, as shown in FIGS. 3A and 3B, and FIG. 4, a first electrode 60 that configures the piezoelectric element 300 is distributed for each pressure generating chamber 12 and configured as an individual electrodes that is independent for each active portion 310. The first electrode 60 is formed with a narrower width than the pressure generating chamber 12 in the first direction X of the pressure generating chamber. That is, the end portion of the first electrode 60 is positioned inside a region that faces the pressure generating chamber 12 in the first direction X of the pressure generating chamber 12. Both end portions of the first electrode 60 extend to the respective outer sides of the pressure generating chamber 12 in the second direction Y.

The material of the first electrode 60 is not particularly limited if the material has conductivity, and, for example, a precious metal such as platinum (PT) or iridium (IR) is suitably used. The first electrode 60 may have an adhesive layer that improves the adhesion of an underlayer to the flow channel-forming substrate 10 side (diaphragm 50 side). For example, titanium (Ti), zirconium (Zr), tantalum (Ta), tungsten (W), nickel (Ni), hafnium (Hf), niobium (Nb), molybdenum (Mo), cobalt (Co) or oxides thereof may be used as the adhesive layer.

The piezoelectric layer 70 is composed of a piezoelectric material of an oxide having a polarized structure formed on the first electrode 60, and for example, may be composed of a perovskite oxide represented by the general formula ABO3, where A may include lead, and B may include at least one of zirconium and titanium. The B, for example, may further include niobium. Specifically, for example, lead zirconate titanate (Pb(Zr,Ti)O3: PZT), lead niobic acid titanic acid zirconic acid including silicon (Pb(Zr,Ti,Nb)O3: PZTNS) or the like may be used as the piezoelectric layer 70.

The piezoelectric layer 70 may be a lead-free piezoelectric material not containing lead, or a complex oxide having a perovskite structure including, for example, bismuth ferrate or bismuth ferrate manganate, barium titanate or bismuth potassium tantalate.

Such a piezoelectric layer 70 is continuously provided along the first direction X so as to have a predetermined width in the second direction Y. The width of the piezoelectric layer 70 in the second direction Y is wider than the length of the pressure generating chamber 12 in the second direction Y Therefore, in the second direction Y of the pressure generating chamber 12, the piezoelectric layer 70 is provided up to the outer side of the pressure generating chamber 12.

In the second direction Y of the pressure generating chamber 12, the end portion of the ink supply channel side of the piezoelectric layer 70 is positioned further to the outside than the end portion of the first electrode 60. That is, the end portion of the first electrode 60 is covered by the piezoelectric layer 70. In addition, the end portion of the nozzle opening 21 side of the piezoelectric layer 70 is positioned further to the inside (pressure generating chamber 12 side) than the end portion of the first electrode 60, and the end portion of the nozzle opening 21 side of the first electrode 60 is not covered by the piezoelectric layer 70.

Furthermore, concavities 71 (refer to FIG. 1) corresponding to each dividing wall 11 are formed in the piezoelectric layer 70. The width of the concavities 71 in the first direction X is substantially the same as the width of each dividing wall 11 in the first direction, or may be wider. In so doing, because rigidity of the portions (so-called arm portion of the diaphragm 50) facing the end portion of the pressure generating chamber 12 of the diaphragm 50 in the second direction Y, the piezoelectric element 300 may be satisfactorily displaced.

Such a piezoelectric layer 70 having a thickness of 0.4 µm or higher and 3 µm or lower may be used.

The piezoelectric layer 70 of the present embodiment may be formed by liquid phase method such as a sol-gel method, a metal-organic decomposition (MOD) method, or a physical vapor deposition (PVD) method such as a sputtering method or a laser ablation method, or the like.

The second electrode 80 is provided on the opposite side surface to the first electrode 60 of the piezoelectric layer 70, and is configured as a common electrode shared by the active portions 310.

In the present embodiment, such a second electrode 80 is provided continuously across the surface of the piezoelectric layer 70 side and on the first electrode 60. The second electrode 80 formed on the first electrode 60, and the second electrode 80 formed on the piezoelectric layer 70 are electrically disconnected via a removal portion 83. Here, the removal portion 83 is provided to penetrate the side on which the first electrode 60 on the piezoelectric layer 70 is drawn out in the thickness direction (lamination direction of the piezoelectric layer 70 and the second electrode 80) of the second electrode 80 along the second direction Y. The first electrode 60 and the second electrode 80 are provided separated by the removal portion 83 so as to not conduct electrically.

Such a piezoelectric element 300 configured by the first electrode 60, the piezoelectric layer 70, and the second electrode 80 generates displacement by applying a voltage between the first electrode 60 and the second electrode 80. That is, by applying a voltage between both electrodes, piezoelectric distortion occurs in the piezoelectric layer 70 interposed between the first electrode 60 and the second electrode 80. When a voltage is applied to both electrodes, the portion in which piezoelectric distortion of the piezoelectric layer 70 occurs is referred to as an active portion 310. In contrast, the portion in which piezoelectric distortion of the piezoelectric layer 70 does not occur is referred to as an inactive portion. In the active portion 310 in which piezoelectric distortion of the piezoelectric layer 70 occurs, the portion opposed to the pressure generating chamber 12 is referred to as a flexible portion, and the portion on the outer side of the pressure generating chamber 12 is referred to as an inflexible portion.

In the present embodiment, in the second direction Y, all of the first electrode 60, the piezoelectric layer 70, and the second electrode 80 are continuously provided up to the outer side of the pressure generating chamber 12. That is, the active portion 310 is continuously provided up to the outer side of the pressure generating chamber 12. Therefore, the portions opposing the pressure generating chamber 12 of the piezoelectric element 300 from the active portions 310 become the flexible portions, and the portions of the outer side of the pressure generating chamber 12 become the inflexible portions.

That is, in the present embodiment, as shown in FIG. 3, the end portion of the active portion 310 in the second direction Y is regulated by the end portion (also includes end portion in light of the removal portion 83) of the second electrode 80.

The end portion of the active portion 310 in the first direction X is regulated by the first electrode 60. The end portion of the first electrode 60 in the first direction X is provided in a region facing the pressure generating chamber 12. Accordingly, the end portion of the active portion 310 in the first direction X is provided on the flexible portion, and stress at the boundary between the active portion 310 and the inactive portion is released by deformation of the diaphragm in the first direction X. Therefore, it is possible to suppress damage such as heat damage or cracking caused by the concentration of stress in the end portion of the active portion 310 in the first direction X.

In such a piezoelectric element 300, because piezoelectric layer 70 covers the main portion of the first electrode 60, there is no leaking of current between the first electrode 60 and the second electrode 80, and it is possible to suppress damage to the piezoelectric element 300. In passing, when the first electrode 60 and the second electrode 80 are exposed in a proximate state, current leaks in the surface of the piezoelectric layer 70 and the piezoelectric layer 70 is damaged. Even if the first electrode 60 and the second electrode 80 are exposed, if the distance is not small, leaking of the current does not occur.

A lead electrode 90 (separate lead electrode 91 and common lead electrode 92) that is a wiring layer in the embodiment is connected to the first electrode 60 and the second electrode 80 of such a piezoelectric element 300.

The separate lead electrode 91 and the common lead electrode 92 (hereinafter, the combination of the two is referred to as a lead electrode 90), although formed from the same layer in the embodiment, are formed to be electrically discontinuous.

The separate lead electrode 91 is drawn out from on the first electrode 60 drawn out on the outer side of the piezoelectric layer 70 up to on the diaphragm 50.

The common lead electrode 92 is drawn out in the second direction Y from on the second electrode 80 up to the diaphragm 50 at both end portions in the first direction X.

The common lead electrode 92 has an extension portion 93 that is a weighting film of the embodiment provided to overlap on the wall surface of the pressure generating chamber 12, that is, the boundary portion of the flexible portion and the inflexible portion in the second direction Y. The extension portion 93 is provided to be continuous along the first direction X of the active portions 310, and continues to the common lead electrode 92 at both end portions in the first direction X. That is, the common lead electrode 92 having the extension portion 93 is arranged to be continuous to surround the periphery of the active portion 310, when viewed planarly from the protective substrate 30 side. Thus, it is possible to improve the rigidity of the boundary between the flexible portion and the inflexible portion and suppress damage to the piezoelectric layer 70 due to the concentration of stress occurring at the boundary by providing the extension portion 93. Although the common lead electrode 92 (extension portion 93) is formed to overlap to the boundary between the flexible portion and the inflexible portion, an opening portion 94 is defined without being provided in the region facing the central portion of the flexible portion. That is, the opening portion 94 is arranged in the region facing the flexible portion and within the range of the active portion 310. It is possible to suppress lowering of the displacement of the active portion 310 by providing the opening portion 94 that opens the main portion of the flexible portion to a common lead electrode 92 in such a manner.

By forming a weighting film with the extension portion 93 extended from the common lead electrode 92, the common lead electrode 92 is continuously electrically connected to the second electrode 80 of the active portions 310 in the parallel direction (first direction) of the active portions 310 through the extension portion 93. Therefore, when a voltage (bias voltage or the like) is applied to the second electrode 80 that is the common electrode for the active portions 310, it is possible to suppress defects due to lowering of the voltage in the parallel direction of the active portions 310. In other words, the active portions 310 are arranged in parallel in the first direction X, and when the electrical resistance value of the second electrode 80 is great, a difference occurs in the voltage applied to the active portions 310 of both end portion sides and the active portion 310 of the central portion in the first direction X. Therefore, it is not possible to drive the active portions 310 with the same voltage, variations occur in the displacement amount, and printing defects occur due to the variations in the discharge characteristics of the ink droplets. In contrast, when the thickness of the second electrode 80 is increased in order to lower the electrical resistance value of the second electrode 80, the second electrode 80 obstructs the displacement of the active portion 310, and the lowering of the displacement amount of the active portion 310 occurs. In the embodiment, the electrical resistance value of the extension portion 93 and the second electrode 80 is lowered by providing the extension portion 93, and it is possible to suppress lowering of the voltage applied to the second electrode 80. Accordingly, it is not necessary to form the second electrode 80 to be thick, it is possible to suppress variations in the displacement amount of the active portions 310, lower the variations in the discharge characteristics of the ink droplets, and improve the print quality, along with being possible to suppress lowering of the displacement of the active portion 310.

The material for such a lead electrode 90 (extension portion 93) is not particularly limited if the material is a metal or metal oxide with high conductivity, and it is possible to use at least one selected from a group consisting of, for example, gold (Au), copper (Cu), and nickel (Ni).

The extension portion 93 that is such a weighting film is formed so that the ratio of the product of the film thickness of the extension portion 93 and Young's modulus of the extension portion 93 with respect to the product of the film thickness of the piezoelectric layer 70 and Young's modulus of the piezoelectric layer 70, that is a represented by the following formula (1) satisfies a range of 0.6 or higher and 1.2 or lower.

$$\alpha = \frac{\text{film thickness of extension portion } 93 \times \text{young's modulus of extention portion } 93}{\text{film thickness of piezoelectric layer } 70 \times \text{young's modulus of piezoelectric layer}} \qquad (1)$$

Figure 5:
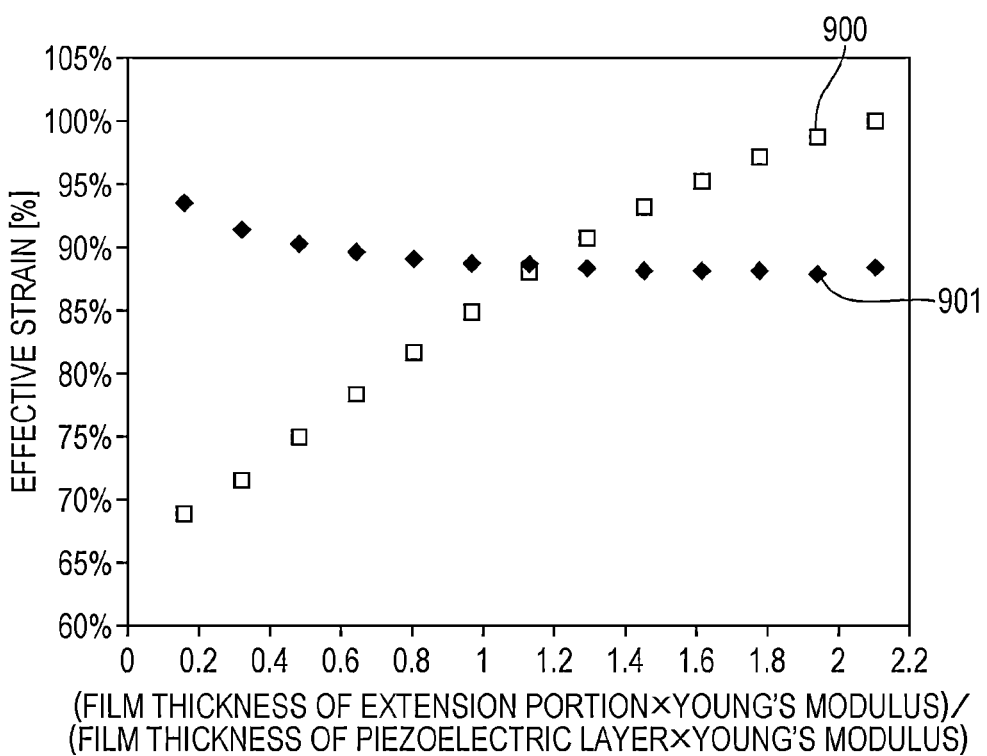
FIG. 5 is a graph showing simulation results according to Embodiment 1 of the invention.

Here, the effective strain (%) that is an index of the damage in the end portion of the pressure generating chamber 12 in the second direction Y and α are calculated with a finite element method. Similarly, the effective strain (%) in the end portion of the opening portion 94 of the extension portion 93 in the second direction Y and α are calculated with the finite element method. The results are shown in FIG. 5. The effective strain shows the proportion (%) of the amount of distortion in a case where when cc is 2.1 is set to 100%.

As shown in FIG. 5, a curve 901 that shows the effective strain in the end portion of the pressure generating chamber 12 with respect to α and a curve 900 that shows the effective strain in the end portion of the opening portion 94 of the extension portion 93 with respect to α cross in the vicinity where α is 1.1.

In contrast to the curve 900 that shows the effective strain in the end portion of the opening portion 94 of the extension portion 93 with respect to a being proportional with respect to a, the curve 901 that shows the effective strain in the end portion of the pressure generating chamber 12 has an inversely proportional relationship with respect to a. The slope of the curve 900 is greater than the slope of the curve 901.

From the above, it is preferable that α be smaller than the intersection (α=1.1) at which the curve 900 and the curve 901 cross. In other words, because the slope of the curve 901 is smaller than the curve 900 and the effective strain for the curve 900 increases rapidly according to the increase in α, if a becomes excessively larger than 1.1, concentration of stress occurs at the end portion of the opening portion 94 of the extension portion 93, and there is concern of damage occurring.

However, if α is slightly larger than 1.1, it is difficult for damage due to the concentration of stress to occur, and it is preferable that α be 1.2 or lower in order for the slope of the curve 900 with respect to α to be large.

Because concentration of stress occurs in the end portion of the pressure generating chamber 12, if α is excessively small, it is preferable that change in the slope of the curve 901 with respect to α is 0.6 or more.

That is, the film thickness of the extension portion 93 may be regulated so that the ratio (hereinafter, α) of the product of the film thickness of the extension portion 93 and Young's modulus of the extension portion 93 and the product of the film thickness of the piezoelectric layer 70 and Young's modulus of the piezoelectric layer 70 is in a range of 0.6 or higher and 1.2 or lower.

In the embodiment, in a case in which lead zirconate titanate (PZT) is used as the piezoelectric layer 70 and gold (Au) is used as the common lead electrode 92, if the film thickness of the piezoelectric layer 70 is set to 0.70 μm, the Young's modulus of the piezoelectric layer 70 to 75 GPa, and the Young's modulus of the extension portion 93 to 85 GPa, the film thickness of the extension portion 93 becomes 0.37 μm to 0.74 μm when 0.6≤α≤1.2. Then, the film thickness of the extension portion 93 for which α is 1.1 becomes 0.68 μm, and the extension portion 93 is favorable formed with a thickness of 0.68 μm.

Although described in detail later, such a lead electrode 90 may be formed by patterning in a predetermined form after being formed across the entirety of one surface of the flow channel-forming substrate 10.

For example, in a case of the lead electrode 90 (common lead electrode 92) with a configuration in which an adhesive layer that improves adhesion between the first electrode 60 and the second electrode 80 and the diaphragm 50 is provided, and a conductive layer in which the electrical resistance value is low is provided on the adhesive layer, α becomes the formula (2) below.

12 and the end portion of the opening portion 94, and to improve the reliability by suppressing the occurrence of cracking or the like in the end portion of the pressure generating chamber 12 and the end portion of the opening portion 94.

As shown in FIGS. 1 to 3, the protective substrate 30 that protects the piezoelectric element 300 is bonded by an adhesive 35 on the flow channel-forming substrate 10 on which such a piezoelectric element 300 is formed. A piezoelectric element holding portion 31 that is a concavity that defines a space that accommodates the piezoelectric element 300 is provided in the protective substrate 30. A manifold portion 32 that configures one portion of the manifold 100 is provided in the protective substrate 30. The manifold portion 32 is formed across the width direction of the pressure generating chamber 12 penetrating the protective substrate 30 in the thickness direction, and communicates with a communication portion 15 of the flow channel-forming substrate 10 as described above. A through hole 33 that penetrates the protective substrate 30 in the thickness direction is provided in the protective substrate 30. The lead electrode 90 (separate lead electrode 91 and common lead electrode 92) connected to the first electrode 60 of each active portion 310 is provided so as to be exposed in the through hole 33.

A driving circuit 120 that functions as a signal processor is fixed to the protective substrate 30. It is possible to use, for example, a circuit substrate, a semiconductor integrated circuit (IC), and the like as the driving circuit 120. The driving circuit 120 and the lead electrode 90 are electrically connected via a connection wiring 121 (external wiring in the present embodiment) formed from a conductive wire such as a bonding wire inserted in the through hole 33. The external wiring is not limited to the connection wiring 121 formed from a conductive wire, and, for example, a flexible printed substrate (FPC) such as a chip on film (COF) or a tape carrier package (TCP) may be connected to the lead electrode 90.

A compliance substrate 40 formed of a sealing film 41 and a fixing plate 42 is bonded on the protective substrate 30. The sealing film 41 is formed of a material having flexibility and low rigidity, and one surface of the manifold portion 32 is sealed by the sealing film 41. The fixing plate 42 is formed from a hard material such as a metal. Since the region of the fixing plate 42 facing the manifold 100 forms an opening portion 43 that is completely removed in the thickness direction, one surface of the manifold 100 is sealed only by the sealing film 41 having flexibility.

$$\alpha = \frac{(\text{film thickness of adhesive layer} \times \textit{young's} \text{ modulus of adhesive layer}) + (\text{film thickness of conductive layer} \times \textit{young's} \text{ modulus of conductive layer})}{(\text{film thickness of piezoelectric layer } 70 \times \textit{young's} \text{ modulus of piezoelectric layer})} \quad (2)$$

In this way, even if the common lead electrode 92 that forms the extension portion 93 is formed with plural layers, if α is 0.6 or higher and 1.2 or lower, it is possible to suppress damage by suppressing the concentration of stress in the end portion of the pressure generating chamber 12 and the end portion of the opening portion 94. Naturally, it is possible to form the conductive layer from plural layers of different materials. In this case, similarly to the above-described formula (2), the product of the film thickness and Young's modulus are obtained for each material, and these may be added.

By regulating the film thickness of the extension portion 93 in this way, it is possible to smoothen the concentration of stress in the end portion of the pressure generating chamber In such an ink jet recording head I of the embodiment, after ink is taken in from an ink introduction port connected to an external ink supply unit not shown in the drawings, and the inner portion is filled with ink from the manifold 100 to the nozzle opening 21, a voltage is applied between each first electrode 60 and second electrode 80 corresponding to the pressure generating chamber 12 according to a recording signal from the driving circuit. In so doing, the pressure in each pressure generating chamber 12 increases by the piezoelectric element 300 and the diaphragm 50 undergoing flexural deformation, and ink droplets are ejected from each nozzle opening 21.

Other Embodiments

Above, although description was made of each embodiment of the invention, the basic configuration of the invention is not limited to the above description.

For example, in the above-described Embodiment 1, although the extension portion 93 that is the weighting film is provided on both ends of the pressure generating chamber 12 in the second direction Y, there is no particular limitation thereto, and, for example, the extension portion 93 may be provided at only one of the end portions of the pressure generating chamber 12 in the second direction Y. The weighting film may be provided at a position facing the end portion of the pressure generating chamber 12 in the first direction X.

In the above-described Embodiment 1, although the extension portion 93 in which a portion of the common lead electrode 92 is extended is provided as the weighting film, there is no particular limitation thereto, a weighting film formed from the same layer as the common lead electrode 92, but not continuous with the common lead electrode 92 may be provided, and further, the weighting film may be formed from a different material from the common lead electrode 92.

Furthermore, in the above-described Embodiment 1, although the elastic film 51 and the insulating film 52 are provided as the diaphragm 50, there is no particular limitation thereto, and, for example, one either of the elastic film 51 or the insulating film 52 may be not provided as the diaphragm 50, or another layer may be provided in addition to the elastic film 51 and the insulating film 52.

Figure 6:
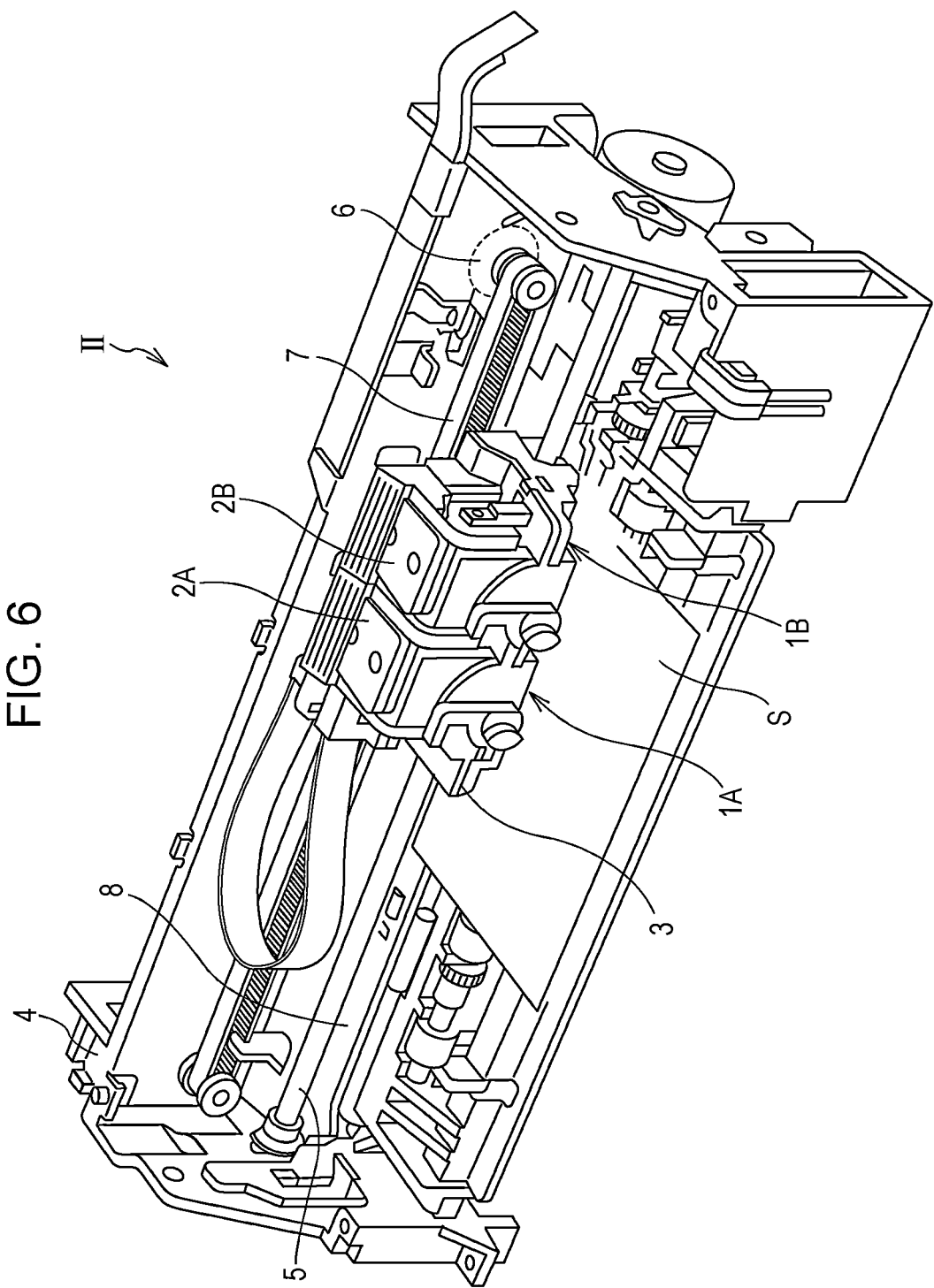
FIG. 6 is a schematic perspective view of a recording apparatus according to one embodiment of the invention.

The ink jet recording head I is mounted in, for example, an ink jet recording apparatus II, as shown in FIG. 6. The recording head unit 1 having the ink jet recording head I is provided with attachable and detachable cartridges 2A and 2B that configure the ink supply unit, and a carriage 3 in which the recording head unit 1 is mounted is provided to be movable in the axial direction on a carriage shaft 5 incorporated in the apparatus main body 4. The recording head unit 1, for example, ejects a black ink composition and a color ink composition.

The carriage 3 in which the recording head unit 1 is mounted is moved along the carriage shaft 5 by the driving force of a driving motor 6 being transmitted to the carriage 3 via a plurality of gears not shown in the drawings, and a timing belt 7. Meanwhile, a platen 8 is provided along the carriage shaft 5 in the apparatus main body 4, and a recording sheet S that is a recording medium such as paper supplied by a paper supplying roller or the like not shown in the drawings is wound on the platen 8 and transported.

In the present invention, it is possible to achieve uniformity of the ejection characteristics while suppressing damage to the piezoelectric element 300 that configures the ink jet recording head I as described above. As a result, it is possible to realize an ink jet recording apparatus II with improved print quality and increased durability.

In the above-described example, the example was given of the ink jet recording apparatus II in which the ink jet recording head I is mounted on the carriage 3 and moves in the main scanning direction; however, the configuration is not particularly limited thereto. The ink jet recording apparatus II, for example, may be a so-called line-type recording apparatus in which the ink jet recording head I is fixed and printing is performed by the recording sheet S, such as paper, being moved in the sub-scanning direction.

In the above-described example, the ink jet recording apparatus II has a configuration in which an ink cartridge 2 that is a liquid storage unit is mounted to the carriage 3; however, there is no particular limitation thereto, and, for example, the liquid storage unit such as an ink tank may be fixed to the apparatus main body 4, and the storage unit and the ink jet recording head I may be connected via a supply pipe such as a tube. The liquid storage unit may be not mounted to the ink jet recording apparatus.

In the above-described embodiment, the present invention was described by example of an ink jet recording head as one example of a liquid ejecting head; however, the invention may be widely targeted to liquid ejecting head in general. In addition to various recording heads used in an image recording apparatus such as a printer, examples of other liquid ejecting heads include color material ejecting heads used in the manufacturing of color filters, such as for liquid crystal displays, electrode material ejecting heads used in forming electrodes such as field emission displays (FED) and organic EL displays, and bioorganic substance ejecting heads used in the manufacturing of bio-chips and the like.

The present invention is not limited to a piezoelectric element mounted to a liquid ejecting head represented by an ink jet recording head, and may be applied to a piezoelectric element mounted to other devices, such as an ultrasonic sensor or a pressure sensor.

What is claimed is:

1. A liquid ejecting head, comprising:
   a flow channel-forming substrate in which a pressure generating chamber that communicates with a nozzle opening is provided; and
   a piezoelectric element, comprising at least one first electrode provided on one surface side of the flow channel-forming substrate corresponding to the pressure generating chamber, a piezoelectric layer provided on the first electrode, a second electrode provided on the piezoelectric layer, and a weighting film;
   wherein the piezoelectric element further comprises one or more active portions, wherein each active portion is a substantial driving portion of the piezoelectric element;
   wherein each of the first electrodes is a separate electrode that is independent for a corresponding one of the active portions;
   wherein the second electrode is a common electrode shared among the active portions;
   wherein the piezoelectric element extends up to the outer side of the pressure generating chamber in at least one end of the pressure generating chamber;
   wherein the weighting film is provided to overlap to one end of the pressure generating chamber on the second electrode in a region extended up to the outer side of the pressure generating chamber;
   wherein (film thickness of the weighting film×Young's modulus of the weighting film)/(film thickness of the piezoelectric layer×Young's modulus of the piezoelectric layer) is in a range of 0.6 or higher and 1.2 or lower;
   and wherein the weighting film is formed from at least one material selected from a group consisting of gold, copper, and nickel.

2. The liquid ejecting head according to claim 1, wherein the film thickness of the piezoelectric layer is from 0.5 μm or more to 3.0 μm or less.

3. A liquid ejecting apparatus comprising the liquid ejecting head according to claim 1.

4. A liquid ejecting apparatus comprising the liquid ejecting head according to claim 2.

5. A piezoelectric element comprising one or more active portions, wherein each active portion is a substantial driving portion of the piezoelectric element, wherein the piezoelectric element further comprises:

at least one first electrode, configured to be provided on one surface side of a substrate in which a space is provided, wherein the first electrode corresponds to the space,
a piezoelectric layer provided on the first electrode,
a second electrode provided on the piezoelectric electrode,
wherein each of the first electrodes is a separate electrode that is independent for a corresponding one of the active portions;
wherein the second electrode is a common electrode shared among the active portions; and
wherein the piezoelectric element is dimensioned so as to extend up to the outer side of the space in at least one end of the space; and
a weighting film, disposed on the second electrode in a region of the second electrode configured to extend up to the outer side of the space, the weighting film being configured and dimensioned so as to overlap to one end of the space;
wherein (film thickness of the weighting film×Young's modulus of the weighting film)/(film thickness of the piezoelectric layer×Young's modulus of the piezoelectric layer) is in a range of 0.6 or higher and 1.2 or lower;
and wherein the weighting film is formed from at least one material selected from a group consisting of gold, copper, and nickel.

6. An ultrasonic sensor comprising at least one of the piezoelectric element according to claim 5.

* * * * *